United States Patent
Chang et al.

(10) Patent No.: US 6,624,661 B2
(45) Date of Patent: Sep. 23, 2003

(54) PROGRAMMABLE DRIVE CIRCUIT FOR I/O PORT

(75) Inventors: Chi Chang, Taipei (TW); Kuo-Ping Liu, Taipei (TW)

(73) Assignee: VIA Technologies, Inc., Taiwan (CN)

( * ) Notice: Subject to any disclaimer, the term of this patent is extended or adjusted under 35 U.S.C. 154(b) by 0 days.

(21) Appl. No.: 10/121,586

(22) Filed: Apr. 15, 2002

(65) Prior Publication Data

US 2003/0034799 A1 Feb. 20, 2003

(30) Foreign Application Priority Data

Aug. 16, 2001 (TW) ........................................ 90120061 A

(51) Int. Cl.$^7$ .......................................... H03K 19/0175

(52) U.S. Cl. .............................. 326/83; 326/57; 326/87

(58) Field of Search .............................. 326/56–58, 80, 326/81, 83, 86, 87

(56) References Cited

U.S. PATENT DOCUMENTS

| | | | | | |
|---|---|---|---|---|---|
| 4,481,432 A | * | 11/1984 | Davies, Jr. | ..................... | 326/50 |
| 4,697,107 A | * | 9/1987 | Haines | ......................... | 326/60 |
| 5,811,997 A | * | 9/1998 | Chengson et al. | ........... | 327/112 |
| 6,242,943 B1 | * | 6/2001 | El-Ayat | ....................... | 326/39 |

* cited by examiner

*Primary Examiner*—Don Le
(74) *Attorney, Agent, or Firm*—Bacon & Thomas PLLC

(57) ABSTRACT

This specification discloses a programmable drive circuit for the I/O port. Using a logic circuit, the driver on the IC I/O port can be programmed to be an open-drained driver or a push-pull driver. In an embodiment of the invention, the programmable drive circuit contains a first transistor group and a second transistor group connected in series between a work voltage and a ground level. A first logic circuit controls the first transistor group, and a second logic circuit controls the second transistor group. The logic circuits are controlled by a select signal so that the first transistor group and the second transistor group become the open-drained driver or the push-pull driver.

20 Claims, 3 Drawing Sheets

PROGRAMMABLE DRIVE CIRCUIT FOR I/O PORT

BACKGROUND OF THE INVENTION

1. Field of Invention

The invention relates to a drive circuit for I/O (Input/Output) ports. More particularly, the invention utilizes a programmable drive circuit to dynamically select an open-drained or push-pull driving circuit on the I/O port of an IC (Integrated Circuit) to achieve communications with a particular CPU (Central Processing Unit).

2. Related Art

In the prior art, there are two types of normal driver architectures for the I/O port: one being the open-drained driving circuits, such as the GTL (Gunning Transmit Logic) bus standards for the I/O port of the Intel P6 CPU; and the other being the push-pull drivers, such as the S2K bus standards for the I/O port of the AMD K7 CPU.

An open-drained driving circuit is shown in FIG. 1. The circuit includes a resistor load R and an N MOS (N-channel Metal-oxide Semiconductor) transistor $Q_A$, connected between a work voltage $V_{dd}$ and the ground in series. The gate end of the NMOS transistor $Q_A$ is connected to an input signal $V_{in}$. The junction between the resistor load R and the drain end provides an output signal $V_o$. When $V_{in}$ is at a high level, the transistor $Q_A$ is conductive and the voltage $V_R$ at a receiving end decreases down to the ground level so that the transistor $Q_A$ can extract a larger load current. This current can make the load capacitance C rapidly discharge. When $V_{in}$ is at a low level, no current flows through the transistor $Q_A$ and the resistor load R provides a load current. The receiving end voltage $V_R$ increases up to the level of $V_{dd}$. This current can rapidly charge the load capacitance C.

A push-pull driving circuit is shown in FIG. 2. The circuit contains a PMOS transistor $Q_B$ (this P-channel MOS transistor can be replaced by an NMOS transistor too) and an NMOS transistor $Q_C$, both being connected between the work voltage $V_{dd}$ and the ground in series. The gate end of the PMOS transistor $Q_B$ is connected to an input signal $V_1$ and that of the N-type MOS transistor $Q_C$ to an input signal $V_2$. The junction of the drain ends of the two transistors provides an output signal $V_o$. When both $V_1$ and $V_2$ are low-level input ($V_1$ is at a high level for the NMOS transistor $Q_B$), $Q_B$ is conductive but $Q_C$ is not. A load current flows through the transistor $Q_B$, rapidly charging the load capacitance C. Consequently, the receiving end voltage $V_R$ is pulled up to the level of $V_{dd}$. The transistor $Q_B$ is thus called a pull-up transistor. When both $V_1$ and $V_2$ are high-level input ($V_1$ is at a low level for the N MOS transistor $Q_B$), $Q_C$ is conductive but $Q_B$ is not. A load current flows through the transistor $Q_C$, rapidly discharging the load capacitance C. Consequently, the receiving end voltage $V_R$ is pulled down to the ground level. The transistor $Q_C$ is thus called a pull-down transistor element.

For the driving circuits in the prior art, such as those shown in FIGS. 1 and 2, the drive circuit design varies for different bus specifications of the I/O port connected to the CPU. For example, the major function of the chip set of a system motherboard is an interface between the CPU and system memory and an interface between the CPU and the external buses for peripheral devices. However, in the same core logic, the drive circuit for the I/O port of the chip set has to comply with the GTL or S2K bus standards for different I/O bus specifications of the P6 or K7 CPU. Therefore, two different I/O port driving circuits have to be provided. This merely complicates the design and the product is limited in its applications.

Therefore, the invention provides a programmable drive circuit to combine the two driving circuits into the I/O port and to control the logic circuits using a select signal. Thus, the I/O port has a programmable circuit for different bus specifications.

An objective of the invention is to provide a programmable drive circuit applicable to the IC I/O port. Using a logic circuit, the I/O port has a circuit structure of both the open-drained and the push-pull driving circuits. Such a design circumvents the necessity of using separate drivers for different system specifications by combining the two driving circuits into the I/O port of an IC.

SUMMARY OF THE INVENTION

As described before, the prior art has to use different drivers in accordance with different IC I/O port specifications. Thus, there are numerous products, resulting in a waste of resources. The invention provides a select signal in the programmable driver of the IC I/O port. Such a select signal switches between the open-drained and push-pull drivers so that the core logic circuit can easily select an appropriate I/O port driver according to the I/O port bus specification.

In an embodiment of the invention, the I/O driver contains a first transistor group and a second transistor group. The I/O is connected between the work voltage and the ground in series. S select signal triggers either a first logic circuit to control the operation of the first transistor group or a second logic circuit to control the operation of the second transistor group. The first transistor group and the second transistor group on the I/O port can function equivalently as either the open-drained driving or the push-pull driving.

BRIEF DESCRIPTION OF THE DRAWINGS

The invention will become more fully understood from the detailed description given hereinbelow, which is by way of illustration only and thus is not limitative of the present invention, wherein.

DETAILED DESCRIPTION OF THE INVENTION

Figure 1:
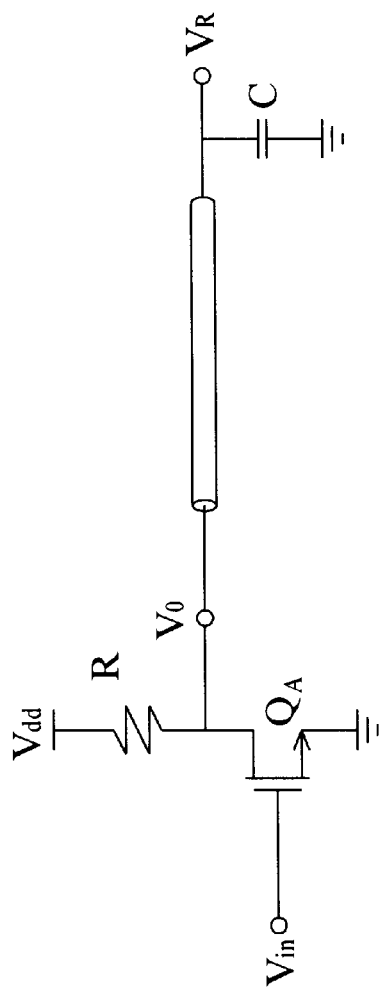
FIG. 1 shows the circuit of an open-drained driving circuit in the prior art.
Figure 2:
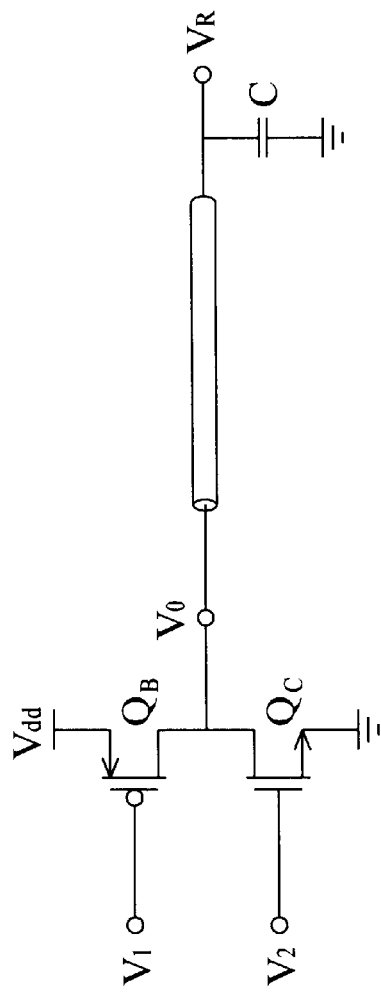
FIG. 2 shows the circuit of a push-pull driver in the prior art.
Figure 3:
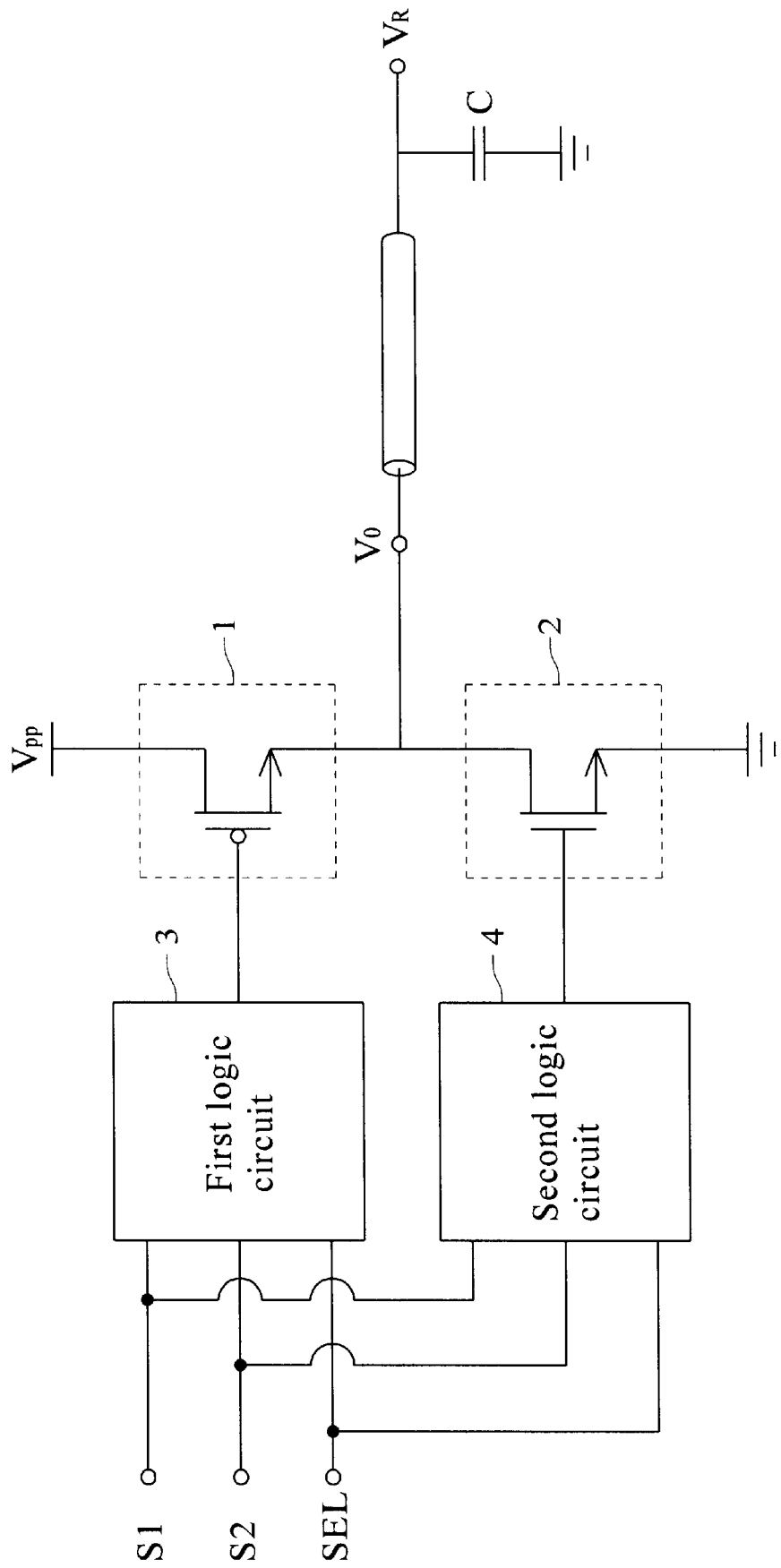
FIG. 3 shows the circuit of the disclosed programmable driver for the I/O port.

With reference to FIG. 3, the structure of a programmable drive circuit disclosed herein includes a first transistor group 1 and a second transistor group 2. In the I/O port, the first transistor group 1 and the second transistor group 2 are connected between a work voltage $V_{pp}$ and the ground in series. The first transistor group 1 and the second transistor group 2 are equivalent to a plurality of transistor switches connected in parallel. For example, the first transistor group 1 is made by a plurality of NMOS transistors connected between the work voltage $V_{PP}$ (the voltage $V_{PP}$ is determined by the CPU; e.g. 1.2V–1.5V for a P6 CPU and 1.2V–1.6V for a K7 CPU) and an output end $V_o$ in series. The second transistor group 2 is made of a plurality of NMOS transistors connected between the output end $V_o$ and the ground in series. The drive circuit of the invention further contains a first logic circuit 3 and a second logic circuit 4, which are used to enable the first transistor group 1 and the second transistor group 2, respectively. The first logic circuit 3 and the second logic circuit 4 receive a first control signal S1 and a second control signal S2, respectively, along with a selection signal SEL. The first control signal S1 and the second control signal S2 are the signals needed for the open-drained and push-pull driving circuits in the disclosed programmable drive circuit. To transmit these signals, there may contain one or more than one signal lines and also a data line.

The transistor group operation mentioned before refers to the operation to make the NMOS transistors in the first transistor group 1 or the second transistor group 2 conductive or not so that either can become equivalent to an open-drained driving circuit for the GTL bus standards or a push-pull driver for the S2K bus standards. When the disclosed programmable driver is equivalent to the open-drained driving circuit for the GTL bus, the first logic circuit 3 enables the first transistor group 1 to function in a linear region. The transistors working in this linear region all have a fixed resistance so as to function like a resistor load R. The second logic circuit 4 enables the second transistor group 2 to function equivalently in the conduction/stop region of the transistor switches. When the programmable driver is equivalent to the push-pull driver for the S2K bus, the first logic circuit 3 enables the first transistor group 1 to function equivalently to the conduction/stop region of the transistor switches so that it becomes a pull-up transistor. The second logic circuit 4, on the other hand, enables the second transistor group 2 to function equivalently to the conduction/stop region of the transistor switch so that it becomes a pull-down transistor. We further explain in detail the operations of the programmable drive circuit for the I/O port.

According to a first embodiment of the invention, the programmable drive circuit on the I/O port triggers the first logic circuit 3 and the second logic circuit 4 using the select signal SEL. The logic circuits then enable the first transistor group 1 and the second transistor group 2 so that they are equivalent to the open-drained driving circuit for the GTL bus. At the same time, the first transistor group 1 and the second transistor group 2 select the first control signal S1 and block the second control signal S2.

When the disclosed driver satisfies the GTL bus, the first control signal S1 and the select signal SEL make the first logic circuit 3 restrict the first transistor group 1 in a linear region, functioning as a resistor load R of the open-drained driving circuit. The first control signal S1 and the select signal SEL make the second logic circuit 4 restrict the second transistor group 2 in the conduction/stop region of the NMOS transistor switch. The equivalent NMOS transistor of the second transistor group can extract a larger load current. Therefore, the drive circuit has all the features of the open-drained driving circuit in the prior art.

According to another embodiment of the invention, the programmable drive circuit on the I/O port triggers the first logic circuit 3 and the second logic circuit 4 using the select signal SEL. The logic circuits enable the first transistor group 1 and the second transistor group 2 so that they are equivalent to the push-pull driving circuit for the S2K bus. At the same time, the first transistor group 1 and the second transistor group 2 select the second control signal S2 and block the first control signal S1.

When the disclosed driver satisfies the S2K bus standards, the second control signal S2 and the select signal SEL make the first logic circuit 3 restrict the first transistor group 1 in the conduction/stop region of the NMOS transistor switch. The first transistor group 1 thus functions as the pull-up transistor of a push-pull driving circuit. The second control signal S2 and the select signal SEL make the second logic circuit 4 restrict the second transistor group 2 in the conduction/stop region of the NMOS transistor switch, functioning as a pull-down transistor of the push-pull driving circuit. Therefore, the drive circuit has all the features of the push-pull driver in the prior art.

In the prior art, the control signal in the GTL bus standards for the P6 CPU I/O port includes PEN, EN and DATA signals. The control signal in the S2K bus standards for the K7 CPU I/O port includes LP, EN and DATA signals. PEN is a pull-up enable signal, EN is an I/O mode signal (EN=0 for the input mode and EN=1 for the output mode), LP is the low power control signal for the K7 CPU, and DATA is the data line. According to a preferred embodiment, the two modes are combined on the I/O port. The first control signal S1 of disclosed programmable drive circuit is thus composed of the PEN, EN and DATA signals, and the second control signal S2 is composed of the LP, EN, and DATA signals. The core logic of the chip set IC can thus select whether to use the open-drained driving circuit or the push-pull driving circuit using a select signal.

Figure 4:
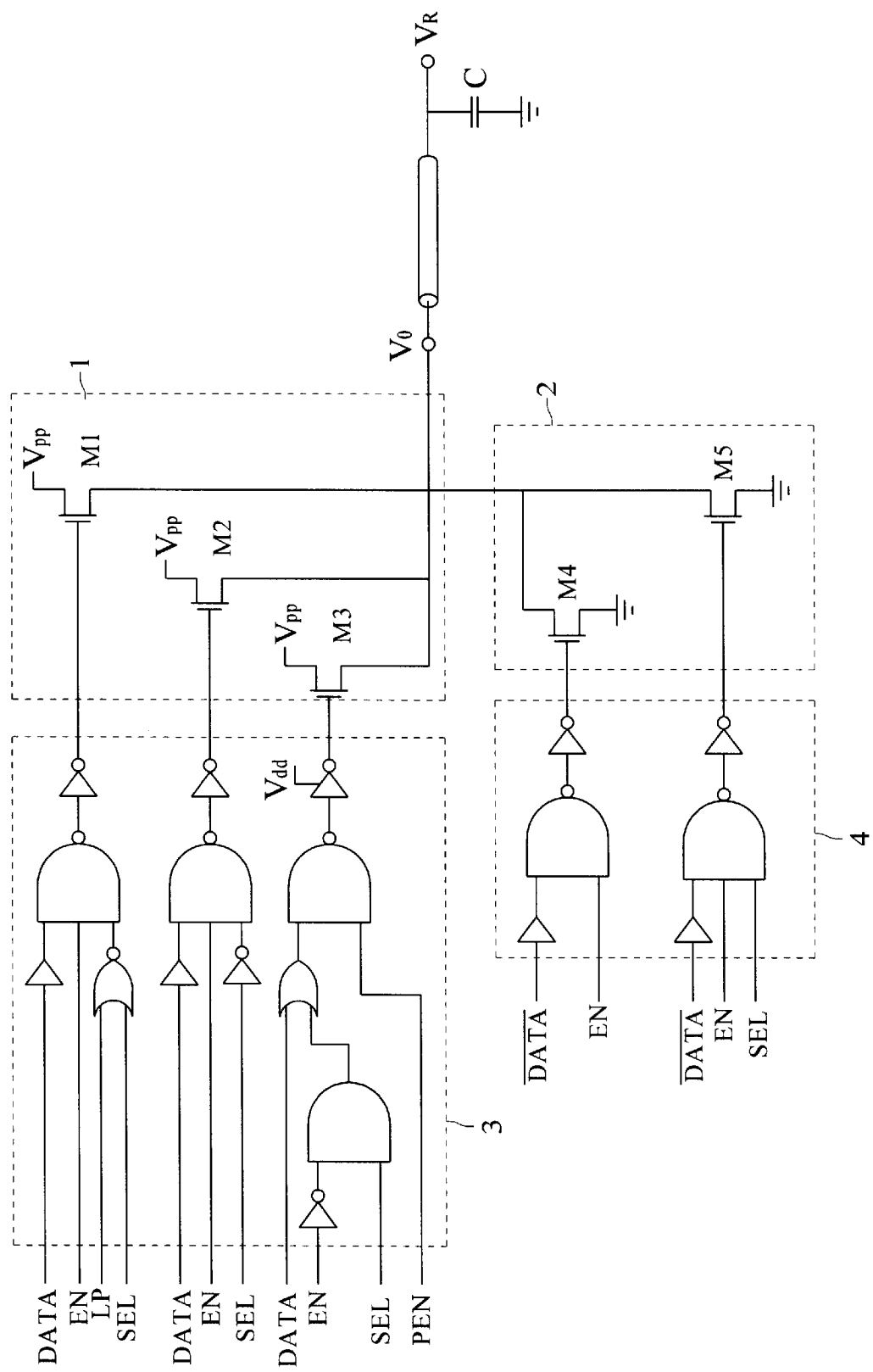
FIG. 4 is a programmable driver for the I/O port according to a preferred embodiment of the invention.

With simultaneous reference to FIGS. 3 and 4, in this preferred embodiment of the invention the first control signal S1 contains the PEN, EN and DATA signals, the second control signal S2 contains the LP, EN and DATA signals, and the select signal is SEL (SEL=0 for the K7 CPU and SEL=1 for the P6 CPU). Additionally, the first transistor group 1 is comprised of NMOS transistors M1, M2 and M3 connected between a work voltage $V_{pp}$ and an output end $V_o$ in parallel. The second transistor group 2 is comprised of NMOS transistors M4 and M5 connected between the output end $V_o$ and the ground. The first logic circuit 3 is composed of a plurality of logic gates. The gate input end of the transistor M1 receives the Boolean algebra of (DATA·EN·$\overline{\text{LP·SEL}}$). The gate input end of the transistor M2 receives the Boolean algebra of (DATA·EN·$\overline{\text{SEL}}$). The gate input end of the transistor M3 receives the Boolean algebra of ($\overline{\text{EN}}$·SEL·PEN+DATA·PEN) and the high level entering the gate of the transistor M3 is $V_{dd}$ ($V_{dd}$ is roughly 2.5V). Analogously, the second logic circuit 4 is composed of a plurality of logic gates. The gate input end of the transistor M4 receives the Boolean algebra of ($\overline{\text{DATA·EN}}$). The gate input end of the transistor M5 receives the Boolean algebra of ($\overline{\text{DATA·EN·SEL}}$).

With further reference to FIG. 4, when the disclosed programmable drive circuit works in the open-drained driving mode for the GTL bus, the select signal SEL=1 and PEN=1. When EN=0 (input mode), the transistors M1 and M2 in the first logic circuit 3 are not conductive and only M3 is conductive. However, the potential difference ($V_{dd}$-$V_{pp}$) between the gate and the drain of the transistor M3 is greater than a threshold voltage $V_t$ of the transistor M3. In this case, the transistor M3 is functioning in the linear region. Thus, the transistor M3 can be viewed as a resistor load R with a fixed resistance. When EN=1 (output mode), the transistor M3 determines whether M3 is conductive according to the DATA signal. When EN=0 (input mode) in the second logic circuit 4, no current flows through either the transistors M4 or M5. When EN=1 (output mode), the inverse DATA determines whether the transistors M4 and M5 should be conductive. Therefore, the action is equivalent to that of an open-drained driving circuit for the GTL bus.

When the programmable drive circuit works in the push-pull driver mode for the S2K bus, the select signal SEL=0 and PEN=0. When EN=0 (input mode), none of the transistors M1, M2 and M3 in the first logic circuit 3 is conductive. When EN=1 (output mode), the transistor M3 is not conductive whereas DATA determines whether the transistor M2 should be conductive. The transistor M1 is not conductive at the lower power control (LP=1), whereas DATA determines whether the transistor M1 is conductive under no lower power control (LP=0). When EN=0 (input mode) in the second logic circuit 4, both the transistors M4 and M5 are not conductive. When EN=1 (output mode), the inverse DATA determines whether the transistor M4 is conductive, whereas the transistor M5 stops its conduction. Consequently, its action is equivalent to that of a push-pull driver for the S2K bus.

EFFECTS OF THE INVENTION

According to the programmable drive circuit for the I/O port, two driving circuits are combined in the I/O port. A selection line is used to control the logic circuit so that the programmable driver can be compliant with different bus specifications. Therefore, the disclosed drive circuit can more effectively program the I/O port so that the IC products like CPU, chipset do not need to have a separate design for different bus driving circuits.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A programmable drive circuit for the I/O port, which comprises:
    a first transistor group and a second transistor group connected between a work voltage and a ground level at the I/O port in series; and
    a logic circuit for receiving a select signal, a first control signal, and a second control signal to enable the first transistor group and the second transistor group;
    wherein the logic circuit enables the first transistor group to function in a linear region and the second transistor group to selectively work in a conduction region and a stop region, and the logic circuit enables both the first transistor group and the second transistor group to selectively work in the conduction and the stop regions.

2. The programmable drive circuit of claim 1 installed on a chip set.

3. The programmable drive circuit of claim 2, wherein the I/O port is connected to an external bus.

4. The programmable drive circuit of claim 3, wherein the external bus is a GTL bus.

5. The programmable drive circuit of claim 3, wherein the external bus is a S2K bus.

6. The programmable drive circuit of claim 1, wherein each of the first transistor group and the second transistor group is comprised of a plurality of NMOS transistors connected in parallel.

7. The programmable drive circuit of claim 6, wherein the first transistor group works in the linear region for providing a bias on one of the NMOS transistors, the bias providing a gate voltage greater than the sum of a drain voltage and a threshold voltage.

8. The programmable drive circuit of claim 1, wherein the first control signal includes an EN signal (I/O mode), a DATA signal (data), and a PEN signal (pull-up enable) so that the I/O port emulates an open-drained driving circuit.

9. The programmable drive circuit of claim 1, wherein the second control signal includes an EN signal (I/O mode), a DATA signal (data), and an LP signal (low power consumption) so that the I/O port emulates a push-pull driving circuit.

10. A programmable drive circuit for the I/O port, which comprises:
    a first transistor group connected between a work voltage and an output end;
    a second transistor group connected between the output end and a ground level;
    a first logic circuit for receiving a select signal, a first control signal, a second control signal so that the first transistor group is selectively equivalent to a resistor with a fixed resistance and a pull-up transistor element; and
    a second logic circuit for receiving the select signal, the first control signal, the second control signal so that the second transistor group is equivalent to a pull-down transistor element.

11. The programmable drive circuit of claim 10 installed on a chip set.

12. The programmable drive circuit of claim 11, wherein the I/O port is connected to an external bus.

13. The programmable drive circuit of claim 12, wherein the external bus is a GTL bus.

14. The programmable drive circuit of claim 12, wherein the external bus is a S2K bus.

15. The programmable drive circuit of claim 10, wherein each of the first transistor group and the second transistor group is comprised of a plurality of N-type MOS (Metal Oxide Semiconductor) transistors connected in parallel.

16. The programmable drive circuit of claim 15, wherein the first transistor group is equivalent to the fixed resistance for providing a bias on one of the NMOS transistors, the bias providing a gate voltage greater than the sum of a drain voltage and a threshold voltage.

17. The programmable drive circuit of claim 10, wherein the first control signal includes an EN signal (I/O mode), a DATA signal (data), and a PEN signal (pull-up enable) so that the I/O port emulates an open-drained driving circuit.

18. The programmable drive circuit of claim 10, wherein the second control signal includes an EN signal (I/O mode), a DATA signal (data), and an LP signal (low power consumption) so that the I/O port emulates a push-pull driving circuit.

19. The programmable drive circuit of claim 10 being an open-drained driving circuit, wherein the first transistor group is equivalent to the fixed resistance and the second transistor group is equivalent to the pull-down transistor element.

20. The programmable drive circuit of claim 10 being a push-pull driving circuit, wherein the first transistor group is equivalent to the pull-up transistor element and the second transistor group is equivalent to the pull-down transistor element.

* * * * *